United States Patent
Moriya et al.

(10) Patent No.: US 6,462,539 B2
(45) Date of Patent: Oct. 8, 2002

(54) MAGNETIC SENSOR WITH FARADAY ELEMENT

(75) Inventors: Naoji Moriya, Nara (JP); Masahiro Ihara, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 09/874,047

(22) Filed: Jun. 6, 2001

(65) Prior Publication Data

US 2002/0000804 A1 Jan. 3, 2002

(30) Foreign Application Priority Data

Jun. 6, 2000 (JP) .................................. 2000-168937

(51) Int. Cl.[7] .......................... G01R 33/032; G02F 1/09
(52) U.S. Cl. .................. 324/244.1; 324/96; 359/484; 385/12
(58) Field of Search .................. 324/96, 244.1; 359/484, 281, 282; 385/12

(56) References Cited

U.S. PATENT DOCUMENTS

| | | | | |
|---|---|---|---|---|
| 4,539,521 A | * | 9/1985 | Matsumoto | 324/244.1 |
| 4,896,103 A | * | 1/1990 | Simanuki et al. | 324/96 |
| 5,053,617 A | * | 10/1991 | Kakizaki et al. | 250/227.21 |
| 5,237,445 A | * | 8/1993 | Kuzuta | 359/281 |
| 5,982,174 A | * | 11/1999 | Wagreich et al. | 324/244.1 |
| 6,370,288 B1 | * | 4/2002 | Itoh et al. | 385/12 |

FOREIGN PATENT DOCUMENTS

| | | | |
|---|---|---|---|
| EP | 0565085 A2 | * 10/1993 | G01R/33/032 |
| JP | 62-46276 A | * 2/1987 | G01R/33/032 |
| JP | 406258412 | * 9/1994 | G01R/33/032 |

OTHER PUBLICATIONS

Deeter, "High Sensitivity Fiber–Optic Magnetic Field Sensors Based on Iron Garnets," IEEE Transactions on Instrumentation and Measurement. vol. 44, No. 2, Apr. 1995, pp. 464–467.*

* cited by examiner

*Primary Examiner*—Edward Lefkowitz
*Assistant Examiner*—Darrell Kinder
(74) *Attorney, Agent, or Firm*—Rader, Fishman & Grauer PLLC

(57) ABSTRACT

Light with a plane of polarization rotated during transmission is converted to parallel light by a collimating lens. The parallel light is transmitted through a first birefringent plate to be separated into two polarized rays orthogonal to each other regardless of the rotation of the plane of polarization. The two polarized rays have planes of polarization rotated by the strength of a magnetic field in the course of transmission through a Faraday element. The polarized rays are reflected by a mirror at a downstream stage, each ray returning along the same optical path and transmitted through the birefringent plate again. At this time, the polarized rays are separated into four polarized rays with different ratios of light intensity according to the rotation of the planes of polarization. From these rays, the collimating lens selects only two orthogonal polarized rays to be detected. The selected rays are detected by a photodetector at a downstream stage. An arithmetic operation is carried out based on the two light intensities, thereby measuring the magnetic field with high sensitivity.

32 Claims, 7 Drawing Sheets

MAGNETIC SENSOR WITH FARADAY ELEMENT

BACKGROUND OF THE INVENTION (1) Field of the Invention

This invention relates to a magnetic sensor utilizing a phenomenon in which a plane of polarization of light traveling through a Faraday element rotates in proportion to the strength of a magnetic field. More particularly, the invention relates to a technique, used in measuring a remote magnetic field, for eliminating influences of variations in the plane of polarization caused by disturbances acting on the light transmitted through optical fibers over a long distance.

(2) Description of the Related Art

A conventional magnetic sensor of this type employs a Faraday element for compactness and high sensitivity. Specifically, the strength of a magnetic field is detected by determining a rotating angle of a plane of polarization applied when polarized light passes through the Faraday element.

Generally, it is adequate to transmit light from a light source by using an optical fiber (single mode optical fiber) and pass the light through a Faraday element with no variations occurring with the plane of polarization. However, the light transmitted through the optical fiber undergoes variations in polarization caused, for example, by phase differences due to disturbances such as environmental conditions encountered during transmission. In such a case, the following techniques are employed to eliminate influences of the variations in polarization due to disturbances and the like.

In a first technique, a polarizer is disposed between the outlet of the optical fiber and the Faraday element to allow only linearly polarized light having a plane of polarization in a particular orientation to pass through the Faraday element.

In a second technique, an optical fiber that maintains a plane of polarization is employed so that light from a light source does not easily undergo variations in the plane of polarization due to disturbances occurring during transmission. As shown in FIG. 1, for example, in order that rays of light R be transmitted with a plane of polarization maintained perpendicular to X-axis, materials 21 are arranged symmetrically across Y-axis to exert a fixed pressure.

However, the conventional constructions noted above have the following drawbacks.

In the first technique having a polarizer disposed between the outlet of the optical fiber and the Faraday element, incident linearly polarized light changes into elliptically polarized light. This is because the light from the light source undergoes indefinite variations in the plane of polarization during transmission through the optical fiber, under the influence of disturbances due to environmental conditions such as temperature and pressure. It is therefore impossible to determine a transmission angle of the polarizer as desired. That is, where the light transmitted through the optical fiber becomes linearly polarized light with a plane of polarization at right angles (90°) to the polarizer, for example, the light is totally blocked by the polarizer and does not enter the Faraday element.

In the second technique employing an optical fiber that maintains a plane of polarization, where the optical fiber is used over a long distance, a discrepancy of polarization occurs from an initial misalignment (Y-axis in FIG. 1) between the plane of polarization maintaining optical fiber and the plane of polarization of incident light. The discrepancy brings about variations in the plane of polarization due to environmental conditions occurring during transmission. The plane of polarization maintaining optical fiber produces crosstalk which is an intrinsic property thereof. This results in extra polarized components precluding accurate detection results.

With detection results acquired under the foregoing conditions, it is difficult to determine whether the rotation of the plane of polarization is due to a magnetic field or to disturbances such as changes in environmental conditions as noted above.

SUMMARY OF THE INVENTION

This invention has been made having regard to the state of the art noted above, and its object is to provide a magnetic sensor of high sensitivity for eliminating influences of disturbance.

The above object is fulfilled, according to this invention, by a magnetic sensor utilizing a phenomenon in which a plane of polarization of light traveling through a Faraday element rotates in proportion to the strength of a magnetic field, the magnetic sensor comprising:

a light output device;

a light branching device connected to the light output device through a first light transmitting device;

a sensor head connected to the light branching device through a second light transmitting device;

a light detecting device connected to the light branching device through a third light transmitting device; and a computing device for receiving detected signals from the light detecting device;

the sensor head including an optical device, a first birefringent plate, a first Faraday element and a reflecting device arranged in series from an end of the sensor head connected to the second light transmitting device;

the light output device outputting light;

the light branching device receiving the light transmitted from the light output device through the first light transmitting device, and emitting the light to the second light transmitting device;

the optical device of the sensor head converting the light transmitted from the light branching device through the second light transmitting device into parallel light;

the first birefringent plate of the sensor head separating the parallel light received from the optical device into two polarized rays having planes of polarization orthogonal to each other with respect to an optical axis of the first birefringent plate;

the first Faraday element of the sensor head transmitting the two polarized rays from the first birefringent plate, and converting the strength of a magnetic field to be detected into a rotating angle of the planes of polarization of the two polarized rays;

the reflecting device of the sensor head reflecting the two polarized rays transmitted through the first Faraday element, back into the first Faraday element, such that each of the two polarized rays reciprocates along the same optical path;

the first birefringent plate of the sensor head separating each of the two polarized rays returned from the first Faraday element into two polarized rays (four polarized rays in total) orthogonal to each other and having an amplitude level corresponding to the rotating angle of the respective polarized rays;

the optical device of the sensor head selectively transmitting two orthogonal polarized rays returning along optical paths substantially the same as incidence optical paths, among the four polarized rays emitted from the first birefringent plate;

the light branching device branching the two polarized rays transmitted from the optical device through the second light transmitting device, to the third light transmitting device:

the light detecting device detecting light intensities of the two polarized rays transmitted from the light branching device through the third light transmitting device; and the computing device deriving the strength of the magnetic field from the light intensities detected by the light detecting device.

Specifically, linear light outputted from the light output device may become elliptically polarized light indefinite in both axis and ellipticity due to disturbances occurring in the course of transmission to the sensor head. Such polarized light is passed through the first birefringent plate disposed in the sensor head, whereby the polarized light may be used as separated into two polarized rays orthogonal to each other based on the crystallographic axis of the birefringent plate, while retaining a total energy of light intensity, regardless of rotation of the planes of polarization.

The two polarized rays have the planes of polarization rotated by magnetic field strength in the course of reciprocation through the first Faraday element. These two polarized rays are transmitted through the first birefringent plate again, where each of the two polarized rays is separated into two polarized rays orthogonal to each other and having an amplitude level corresponding to the rotating angle of the respective planes of polarization. The polarized rays not traveling along the same optical paths as the incidence optical paths are omitted by the optical device. That is, the light intensities of the two polarized rays emitted from the optical device are variable with the rotating angle of the planes of polarization of the polarized rays emitted from the first Faraday element. The light intensities of the two polarized rays are detected by the light detecting device, and are put to an arithmetic operation by the computing device, thereby obtaining detection results free from the influences of variations in the planes of polarization due to disturbances.

Since the light is transmitted forward and backward through the first Faraday element, the sensitivity of the element is improved.

Further, since the second light transmitting device is shared by the light entering the sensor head and the light exiting the sensor head, the apparatus may be formed compact.

The foregoing magnetic sensor in the first aspect of the invention may further comprise an element disposed between the first birefringent plate and the first Faraday element for giving a predetermined rotating angle to the plane of polarization of each of the two polarized rays separated by the first birefringent plate.

According to the above magnetic sensor, light that is to be detected without influences of a disturbance or magnetic field is passed through the element disposed downstream of the first birefringent plate, to apply a predetermined rotating angle to the planes of polarization beforehand. As a result, the light intensities detected by the light detecting device are varied according to the direction of the magentic field to be measured.

That is, actual detection results may be compared with a reference provided by the light intensity detected when the magentic field to be measured is "0", whereby the direction as well as the strength of the magnetic field may be detected.

Preferably, the above element is a Faraday element having a predetermined magnetic field applied thereto beforehand.

The magnetic sensor in the first aspect of the invention may further comprise an aperture plate disposed between the optical device and the first birefringent plate and defining a pinhole for passing the two polarized rays to be detected.

With the above construction, the pinhole in the plate disposed between the optical device and the first birefringent plate passes only two polarized rays to be detected. That is, where the first birefringent plate is formed thin to make the sensor head compact, the polarized rays transmitted through the first birefringent plate have small refractive indexes (angles), making it difficult to select and output two polarized rays to be detected. However, by using the pinhole, only two polarized rays to be detected may be selected and outputted.

The magnetic sensor in the first aspect of the invention may further comprise a second optical device disposed between the first birefringent plate and the first Faraday element;

the second optical device refracting two incident polarized rays, and emitting the polarized rays to the first Faraday element, such that the polarized rays intersect each other in the first Faraday element;

the reflecting device reflecting the two polarized rays emitted from the first Faraday element, such that the polarized rays swap optical paths, each returning along an optical path substantially the same as an incidence optical path of the other.

The two polarized rays incident on the second optical device are refracted and emitted toward the first Faraday element. The two polarized rays intersect each other in the first Faraday element. The two polarized rays emitted from the first Faraday element are reflected by the reflecting device, each returning along an optical path substantially the same as an incidence optical path of the other.

Thus, each of the two polarized rays travels through the Faraday element, backward along substantially the same optical path as the forward optical path of the other. Even where the first Faraday element has position dependence for crystal sensitivity, the two polarized rays are given the same level of extra error in rotating angle of the planes of polarization. That is, there is no need to consider measurement errors even though variations may occur in intensity ratio between the two polarized rays due to disturbances acting on the light transmitting device.

The above reflecting device may be attached to or disposed adjacent a light output end of the first Faraday element. Preferably, the reflecting device is a reflecting mirror, or a rectangular prism with reflection coatings applied to polarized light output slant sides thereof.

The magnetic sensor in the first aspect of the invention may further comprise a second optical device disposed between the first Faraday element and the reflecting device disposed adjacent the first Faraday element;

the second optical device refracting two incident polarized rays from the first Faraday element, and emitting the two polarized rays to the reflecting device, such that the two polarized rays intersect each other before reaching the reflecting device;

the reflecting device reflecting the two polarized rays, such that the polarized rays swap optical paths, each returning along an optical path substantially the same as an incidence optical path of the other.

With the above construction, one of the polarized rays refracted by the second optical device and reflected by the reflecting device returns along an optical path substantially the same as an incidence optical path of the other polarized ray, and the other polarized ray returns along an optical path substantially the same as an incidence optical path of the one polarized ray. Thus, where the first Faraday element has position dependence for crystal sensitivity, the two polarized rays are influenced by the same error in rotating angle of the planes of polarization. That is, there is no need to consider measurement errors due to variations in intensity ratio between the two polarized rays.

In the above magnetic sensor, the first Faraday element may be in form of two separate Faraday elements arranged parallel to each other in a traveling direction of the two polarized rays, such that the two polarized rays separated by the first birefringent plate are transmitted through the separate Faraday elements, respectively.

With the two separate Faraday elements arranged parallel to each other in the traveling direction of the two polarized rays, crystals of small sectional area may be used to realize high Faraday effect. The sensor head may also be formed compact.

The magnetic sensor in the first aspect of the invention may further comprise a second optical device disposed between the first birefringent plate and the first Faraday element;

the second Faraday element transmitting and emitting one of the two polarized rays separated by the first birefringent plate;

the second Faraday element transmitting and emitting the other of the two polarized rays after the polarized rays swap the optical paths thereof and return from the reflecting device.

That is, each of the polarized rays separated by the first birefringent plate is transmitted once through the second Faraday element to give a predetermined rotating angle to each of the two planes of polarization. Since each polarized ray is transmitted only once through the second Faraday element, the plane of polarization undergoes a minimum influence of errors due to a product tolerance of the second Faraday element.

The first birefringent plate may be formed of any birefringent element. Preferred examples of such materials are rutile crystal expressed by $TiO_2$, calcite expressed by $CaCO_3$, lithium niobate expressed by $LiNbO_3$ and yttrium vanadate expressed by $YVO_4$. The first to third light transmitting devices, preferably, comprise single mode optical fibers, or plane of polarization maintaining optical fibers.

In a second aspect of this invention, a magnetic sensor utilizing a phenomenon in which a plane of polarization of light traveling through a Faraday element rotates in proportion to the strength of a magnetic field, the magnetic sensor comprising:

a light output device;

a sensor head connected to the light output device through a first light transmitting device;

a light detecting device connected to the sensor head through a second light transmitting device; and a computing device for receiving detected signals from the light detecting device;

the sensor head including a first optical device, a first birefringent plate, a first Faraday element, a second birefringent plate and a third optical device arranged in series from an end of the sensor head connected to the first light transmitting device;

the light output device outputting light;

the first optical device of the sensor head converting polarized light transmitted from the light output device through the first light transmitting device into parallel light;

the first birefringent plate of the sensor head separating the parallel light received from the first optical device into two polarized rays having planes of polarization orthogonal to each other with respect to an optical axis of the birefringent plate;

the first Faraday element of the sensor head transmitting the two polarized rays from the first birefringent plate, and converting the strength of a magnetic field to be detected into a rotating angle of the planes of polarization of the two polarized rays;

the second birefringent plate of the sensor head separating each of the two polarized rays transmitted through the first Faraday element into two polarized rays (four polarized rays in total) orthogonal to each other with respect to an optical axis of the birefringent plate;

the third optical device of the sensor head selectively transmitting two orthogonal polarized rays returning along optical paths substantially the same as incidence optical paths, among the four polarized rays emitted from the second birefringent plate;

the light detecting device detecting light intensities of the two polarized rays transmitted from the second optical device through the second light transmitting device; and the computing device deriving the strength of the magnetic field from the light intensities detected by the light detecting device.

Linear light outputted from the light output device may become elliptically polarized light indefinite in both axis and ellipticity due to disturbances occurring in the course of transmission to the sensor head. Such polarized light is passed through the first birefringent plate disposed in the sensor head, whereby the polarized light may be used as separated into two polarized rays orthogonal to each other based on the crystallographic axis of the birefringent plate, while retaining a total energy of light intensity, regardless of rotation of the planes of polarization. The two polarized rays have the planes of polarization rotated by magnetic field strength in the course of transmission through the first Faraday element. Thereafter the two polarized rays are transmitted through the second birefringent plate. Then, the two polarized rays are separated into two groups of two polarized rays (four polarized rays in total) orthogonal to each other according to a rotating angle of the planes of polarization, and are emitted to the second optical device. From the four polarized rays, the second optical device selects and outputs two polarized rays orthogonal to each other returning along optical paths substantially the same as incidence optical paths. The remaining two polarized rays are omitted by the second optical device. That is, the light intensities of the two polarized rays emitted from the optical device are variable with the rotating angle of the planes of polarization of the polarized rays emitted from the first Faraday element.

The light intensities of the two polarized rays are detected by the light detecting device, and are put to an arithmetic operation by the computing device, thereby obtaining detection results free from the influence of variations in the planes of polarization due to disturbances.

The above magnetic sensor in the second aspect of the invention may further comprise an element disposed between the first birefringent plate and the first Faraday element for giving a predetermined rotating angle to the plane of polarization of each of the two polarized rays separated by the first birefringent plate.

Alternatively, the magnetic sensor in the second aspect of the invention may further comprise an element disposed between the first Faraday element and the second optical device for giving a predetermined rotating angle to the plane of polarization of each of the two polarized rays separated by the first birefringent plate.

According to the above magnetic sensor, light that is to be detected without influences of a disturbance or magnetic field is passed through the second Faraday element disposed downstream of the birefringent plate or the first Faraday element, to apply a predetermined rotating angle to the planes of polarization beforehand. As a result, the light intensities detected by the light detecting device are varied according to the direction of the magnetic field to be measured.

That is, actual detection results may be compared with a reference provided by the light intensity detected when the magnetic field to be measured is "0", whereby the direction as well as the strength of the magnetic field may be detected.

The magnetic sensor in the second aspect of the invention may further comprise an aperture plate disposed between the second birefringent plate and the optical device and defining a pinhole for passing the two polarized rays to be detected.

With the above construction, the pinhole in the plate disposed between the second birefringent plate and second optical device passes only two polarized rays to be detected. That is, where the first and second birefringent plates are formed thin to make the sensor head compact, the polarized rays transmitted through each birefringent plate have small refractive indexes (angles), making it difficult to select and output two polarized rays to be detected. However, by using the pinhole, only two polarized rays to be detected may be selected and outputted.

The first and second birefringent plates may be formed of any birefringent element. Preferred examples of such materials are rutile crystal expressed by $TiO_2$, calcite expressed by $CaCO_3$, lithium niobate expressed by $LiNbO_3$ and yttrium vanadate expressed by $YVO_4$. The first to third light transmitting devices, preferably, comprise single mode optical fibers, or plane of polarization maintaining optical fibers. Further, the element noted above, preferably, is a Faraday element having a predetermined magnetic field applied thereto beforehand.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be described in detail hereinafter with reference to the drawings.

[First Embodiment]

Figure 1:
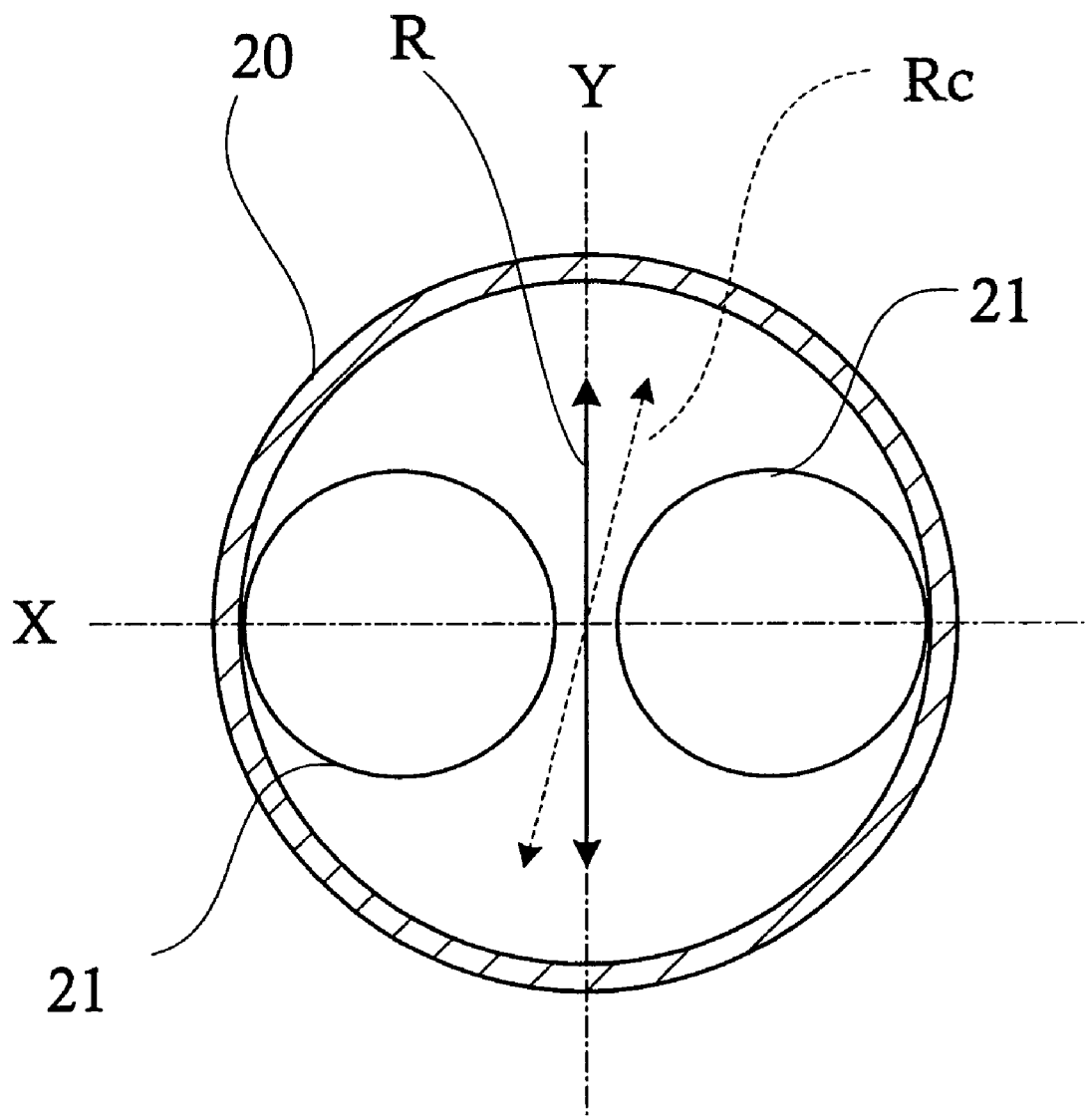
FIG. 1 is a sectional view of a plane of polarization maintaining optical fiber.
Figure 2:
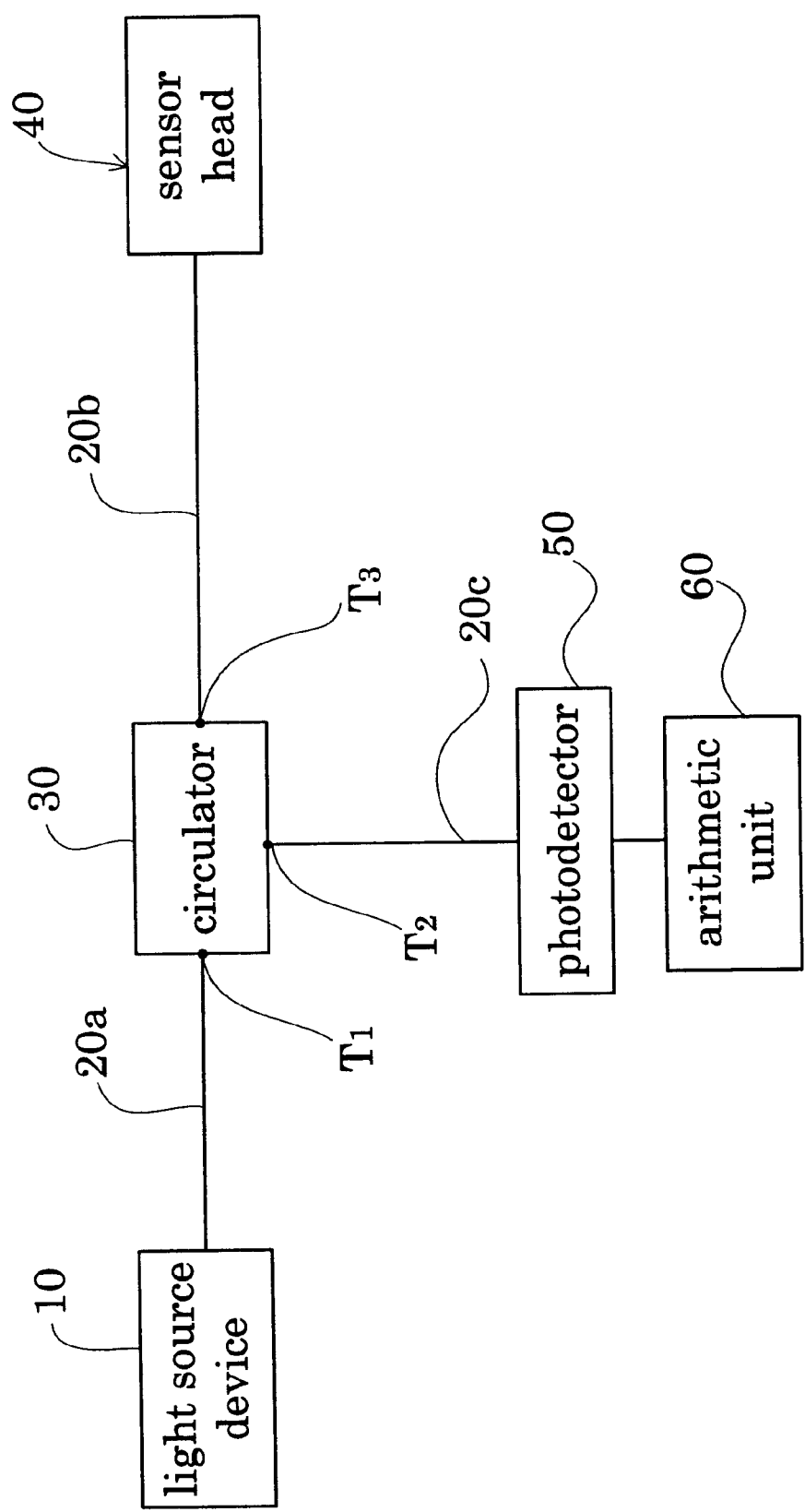
FIG. 2 is a block diagram of a magnetic sensor according to this invention.

FIG. 2 is a view showing a construction of a magnetic sensor in a first embodiment of this invention.

The magnetic sensor in this embodiment, broadly, includes a light source device 10 for generating light, a circulator 30 for branching light according to traveling directions, a sensor head 40 for converting the strength of a magnetic field into a rotating angle of planes of polarization, a photodetector 50 for converting the intensity of polarized light detected into an electric signal, and an arithmetic unit 60 for deriving a magnetic field strength from the electric signal of the light intensity detected. The light source device 10 is connected to the circulator 30 through an optical fiber 20a. The sensor head 40 is connected to the circulator 30 through an optical fiber 20b. The photodetector 50 is connected to the circulator 30 through an optical fiber 20c. The light source device 10 corresponds to the light output device of this invention, each of the optical fibers 20a, 20b and 20c to the light transmitting device, the circulator 30 to the light branching device, the photodetector 50 to the light detecting device, and the arithmetic unit 60 to the computing device.

Constructions and functions of these components will particularly be described hereinafter.

The light source device 10 outputs light generated by a light emitting element such as a laser diode or LED and condensed by a lens or the like.

The optical fibers 20a, 20b and 20c are in the form of single mode optical fibers or plane of polarization maintaining optical fibers.

The circulator 30 has one input terminal T1, one output terminal T2, and one terminal T3 acting as both input and output of light. The optical fiber 20a is connected to the input terminal T1, the optical fiber 20c to the output terminal T2, and the optical fiber 20b to the input and output terminal T3. That is, light outputted from the light source device 10 and transmitted through the optical fiber 20a is once inputted to the circulator 30, and outputted therefrom to the sensor head 40 through the optical fiber 20b. Polarized light to be detected is outputted from the sensor head 40 at the downstream stage back into the same optical fiber 20b and inputted to the circulator 30. In the circulator 30, the initial light from the light source device 10 and the polarized light to be detected are separated according to the traveling directions. The circulator 30 outputs only the polarized light to be detected to the photodetector 50 at the downstream stage through the optical fiber 20c.

Figure 3:
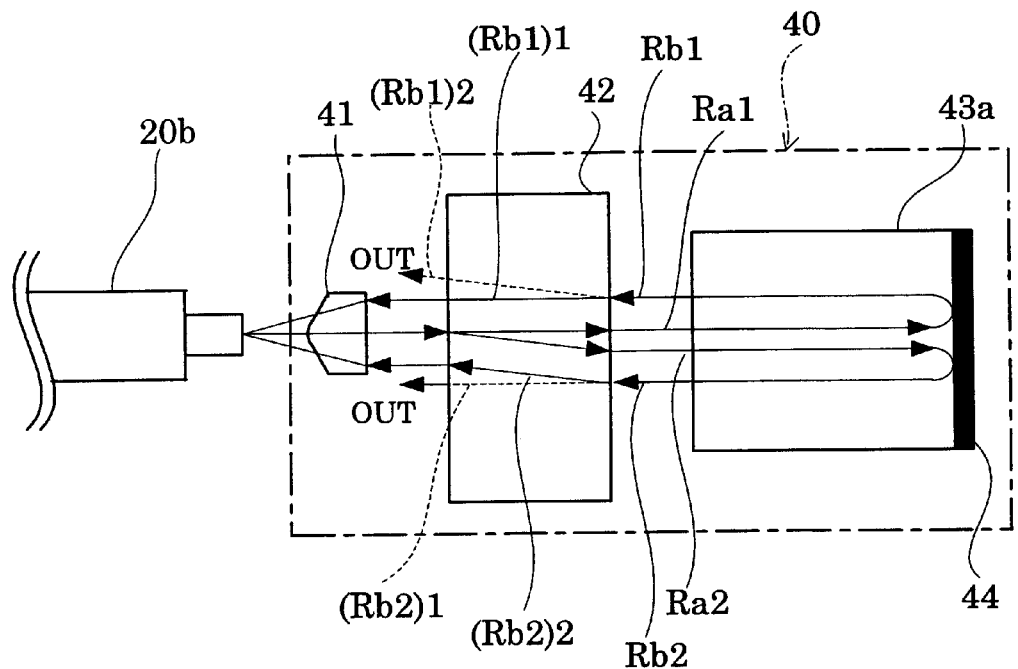
FIG. 3 is a view showing a construction of a magnetic head of a magnetic sensor in a first embodiment.

As shown in FIG. 3, the sensor head 40 includes a collimator lens 41 for converting the light emerging from the optical fiber 20b into parallel light, a birefringent plate 42 for transmitting the parallel light exiting the collimating lens 41 and separating the light into two orthogonally polarized rays (ordinary ray and extraordinary ray), a Faraday element 43a for transmitting the two polarized rays received from the birefringent plate 42 and changing the strength of a magnetic field to be detected into a rotating angle of planes of polarization, and a reflecting mirror 44 for reflecting the two polarized rays transmitted through the Faraday element 43a to be transmitted back through the Faraday element 43a. The collimating lens 41 corresponds to the optical device of this invention, the Faraday element 43a to the first Faraday element, and the reflecting mirror 44 to the reflecting device.

In the course of transmission over a long distance through the optical fibers 20a and 20b and the circulator 30, the light is polarized with an indefinite plane of polarization caused by disturbances such as environmental conditions (temperature and pressure). The collimating lens 41 converts this polarized light into, and outputs, parallel light.

The two polarized rays reflected by the reflecting mirror 44 at the downstream stage travel back through the same optical paths through Faraday element 43a and then through the birefringent plate 42. Each polarized ray is further separated into two orthogonally polarized rays in the course of transmission through the birefringent plate 42, thereby forming a total of four polarized rays. The collimating lens 41 selects, from the four polarized rays, the polarized rays that return along optical paths, after exiting the birefringent plate 42, substantially the same as the incidence optical paths, and outputs the selected polarized rays back into the optical fiber 20b. At this time, the polarized rays selected are orthogonal to each other. That is, the two remaining polarized rays traveling along optical paths other than the incidence optical paths are omitted. It should be noted that the optical device of this invention is not limited to the collimating lens 41 or to a particular number or shape.

The birefringent plate 42 has a characteristic to separate incident light, while transmitting the light, into two polarized rays with mutually orthogonal planes of polarization regardless of the state of the plane of polarization of the incidence light. That is, the birefringent plate 42 has a crystallographic axis and, when linearly polarized light with a plane of polarization coinciding with the crystallographic axis is transmitted through the birefringent plate 42, the light is outputted intact as a single polarized ray. However, when polarized light not having a single plane of polarization, such as elliptically polarized light, is transmitted through the birefringent plate 42, the light is separated into two mutually orthogonal polarized rays, one as an ordinary ray Ra1 and the other as an extraordinary ray Ra2, to travel along different optical paths. That is, in the course of transmission through the birefringent plate 42, the parallel light is separated into two mutually orthogonal polarized rays Ra1 and Ra2 while retaining a total light intensity. The ordinary rays Ra1 of the two polarized rays Ra1 and Ra2 is transmitted vertically through the birefringent plate 42, while the other, extraordinary ray Ra2 is refracted.

When the two polarized rays Rb1 and Rb2 are returned from the Faraday element 43a at the downstream stage without a magnetic field applied by the Faraday element 43a to rotate the planes of polarization, the polarized rays Rb1 and Rb2 are returned along optical paths substantially the same as incident optical paths without being separated during transmission through the birefringent plate 42. On the other hand, when the two polarized rays Rb1 and Rb2 are returned from the Faraday element 43a with the planes of polarization rotated by a magnetic field applied by the Faraday element 43a, each of the polarized rays Rb1 and Rb2 has the plane of polarization already shifted from the angle parallel or perpendicular to the crystallographic axis of birefringent plate 42 by the time the ray Rb1 or Rb2 is transmitted through the birefringent plate 42. Consequently, each polarized ray Rb1 or Rb2 is separated into two polarized rays orthogonal to each other. That is, each of the polarized rays Rb1 and Rb2 is separated into two polarized rays with a different ratio of light intensity according to a rotating angle of the plane of polarization. Specifically, each polarized ray Rb1 or Rb2 is separated into an extraordinary ray (Rb1)2 or (Rb2)2 with the plane of polarization rotated by the strength of a magnetic field, and an ordinary ray (Rb1)1 or (Rb2)1 with the light intensity attenuated as a result of separation from the extraordinary ray (Rb1)2 or (Rb2)2. Thus, in the birefringent plate 42, a varied light intensity ratio occurs between the ordinary ray (Rb1)1 or (Rb2)1 and extraordinary ray (Rb1)2 or (Rb2)2 in accordance with the rotating angle of the plane of polarization.

The birefringent plate 42 is arranged such that the two polarized rays Ra1 and Ra2 separated first travel through the Faraday element 43a at the downstream stage. The thicker the birefringent plate 42 is, the further away the two polarized rays Ra1 and Ra2 tend to diverge from each other. Thus, the birefringent plate 42 has a thickness determined by taking its positional relationship with the collimating lens 41 and Faraday element 43a into account. Preferably, the birefringent plate 42 is formed of $TiO_2$ (rutile crystal), $CaCO_3$ (calcite), $LiNbO_3$ (lithium niobate) or $YVO_4$ (yttrium vanadate), for example.

The Faraday element 43a is arranged such that the optical paths of the two polarized rays Ra1 and Ra2 transmitted therethrough extend substantially parallel to the direction of a magnetic field to be measured. Preferably, the Faraday element 43a is formed of yttrium iron garnet, for example.

The reflecting mirror 44 is disposed parallel to an exit end surface of Faraday element 43a to reflect the two polarized rays Ra1 and Ra2 transmitted through the Faraday element 43a so that the polarized rays Ra1 and Ra2 travel back along optical paths substantially the same as the incidence optical paths, respectively. The reflecting mirror 44 may be spaced from the end surface of Faraday element 43a.

The photodetector 50 detects the light intensities of the two polarized rays having the planes of polarization rotated by the strength of a magnetic field in the sensor head 40, and transmitted through the optical fiber 20b, circulator 30 and optical fiber 20c in the stated order. The photodetector 50 converts the light intensities into electric signals and outputs the signals to the arithmetic unit 60. The photodetector 50 may be in the form of a photodiode, for example.

The arithmetic unit 60 derives the magnetic field strength around the Faraday element 43a from the electric signals received from the photodetector 50.

Operation of the magnetic sensor having the above construction will be described next.

The light emitted from the light source device 10 emerges from the optical fiber 20b as changed into an elliptically polarized light in the course of transmission, and enters the sensor head 40. The elliptically polarized light at this time has a Jones vector component expressed by the following equation (1):

$$A = \begin{pmatrix} \sin(\theta)e^{-j\omega t} \\ \cos(\theta)e^{-(\omega t+\delta)} \end{pmatrix} \quad (1)$$

where $\theta$ and $\delta$ are indefinite values variable with conditions of the optical fibers.

The elliptically polarized light transmitted to the sensor head 40 is converted into parallel light by the collimator lens 41 and outputted to the birefringent plate 42. In the course of transmission through the birefringent plate 42, the parallel light is separated into two polarized rays Ra1 and Ra2 and outputted to the Faraday element 43a. The birefringent plate 42 has a characteristic (transmission characteristic from left to right in FIG. 3) expressed by the following equations (2) and (3) based on Jones characteristic. Equation (2) expresses an ordinary ray (polarized ray Ra1) while equation (3) expresses an extraordinary ray (polarized ray Ra2).

$$B = \begin{pmatrix} 1 & 0 \\ 0 & 0 \end{pmatrix} \quad (2)$$

$$C = \begin{pmatrix} 0 & 0 \\ 0 & 1 \end{pmatrix} \quad (3)$$

In the course of transmission through the Faraday element 43a, the two polarized rays Ra1 and Ra2 have the planes of polarization rotated by the strength of a magnetic field. The polarized rays Ra1 and Ra2 are then reflected by the reflecting mirror 44 on the end surface of Faraday element 43a to travel back along the same optical paths. With the planes of polarization further rotated, the polarized rays Ra1 and Ra2 become polarized rays Rb1 and Rb2 to be returned to the birefringent plate 42.

The polarized light transmitted to the end surface of Faraday element 43a has a vector component expressed by equation (4a) below. The reflecting mirror 44 has a reflection coefficient expressed by equation (5) below. The polarized light reflected by the reflecting mirror 44 back into the Faraday element 43a has a vector component expressed by equation (6a) below.

$$D = \begin{pmatrix} \cos(SH) & -\sin(SH) \\ \sin(SH) & \cos(SH) \end{pmatrix} \quad (4a)$$

$$E = \begin{pmatrix} 1 & 0 \\ 0 & -1 \end{pmatrix} \quad (5)$$

$$F = \begin{pmatrix} \cos(-(SH)) & -\sin(-(SH)) \\ \sin(-(SH)) & \cos(-(SH)) \end{pmatrix} \quad (6a)$$

In the above equations (4a) and (6a), S is the sensitivity of the Faraday element, and H is a magnetic field.

Each of the two polarized rays Rb1 and Rb2 is further separated into two polarized rays by the birefringent plate 42. That is, each ray is separated into an extraordinary ray (Rb1)2 or (Rb2)2 with the plane of polarization rotated, and an ordinary ray (Rb1)1 or (Rb2)1 with the plane of polarization not rotated.

Of the four polarized rays (Rb1)1, (Rb2)1, (Rb1)2 and (Rb2)2, the ordinary ray (Rb1)1 and extraordinary ray (Rb2)2 enter the collimating lens 41 to be condensed and returned to the optical fiber 20b for transmission to the circulator 30. In the circulator 30, the two polarized rays (Rb1)1 and (Rb2)2 are distinguished from the light (initial light) transmitted from the light source device 10, and are outputted from the terminal T2. At this time, the birefringent plate 42 has a characteristic (transmission characteristic from right to left in FIG. 3) expressed by the following equations (7) and (8):

ordinary ray ((Rb1)1): G=(1 0) (7)

extraordinary ray ((Rb2)2): H=(0 1) (8)

The two polarized rays (Rb1)1 and (Rb2)2 to be detected are applied to the photodetector 50 through the optical fiber 20c, and converted into electric signals to be inputted to the arithmetic unit 60. The strength of the magnetic field is derived from an arithmetic process described below.

A method of arithmetic operation performed by the arithmetic unit 60 will be described next.

Assume that the light emitted from the light source device 10 and transmitted through the optical fibers 20a, 20b and 20c is elliptically polarized by disturbances. Then, the light intensities of the two polarized rays (Rb1)1 and (Rb2)2 measured by the photodetector 50 may be expressed by the following equations (9a) and (10a), using the foregoing equations (1) to (8) of vector components, and using Jones matrix:

polarized ray (Rb1)1=G·F·E·D·B·A (9a)

polarized ray (Rb2)2=H·F·E·D·C·A (10a)

Light energy, i.e. light intensity, being transmitted is conserved owing to the characteristic of the optical fibers. It is therefore unnecessary to consider the loss of light intensity occurring while the polarized rays (Rb1)1 and (Rb2)2 are transmitted from the optical fiber 20b to the photodetector 50.

Therefore, light intensity W detected by the photodetector 50 is equal to a value obtained by squaring each of the above equations (9a) and (10a) to convert the vector component into an energy component and adding the two together. That is, light intensity W may be expressed by the following equation (11a):

$$W=1-\sin^2(2SH) \quad (11a)$$

In the above operational expression, for example, a series expansion is performed to second order by assuming a range of weak magnetic field measurement (2SH<<1) for making sin(2SH)≈2SH.

The result may be expressed by the following equation (12a):

$$W=1-(2SH)^2 \quad (12a)$$

That is, the arithmetic unit 60 can derive a measured magnetic field H, which is an unknown quantity, from the equation (12a) based on the light intensity W detected.

[Second Embodiment]

Figure 4:
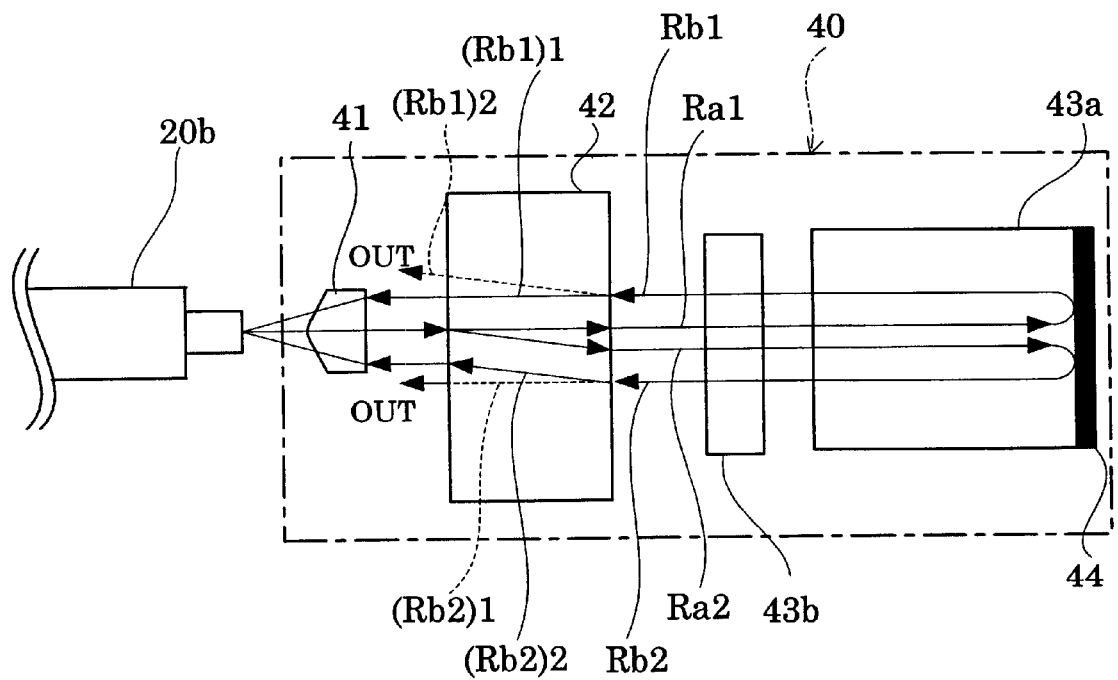
FIG. 4 is a view showing a construction of a magnetic head of a magnetic sensor in a second embodiment.

FIG. 4 is a view showing a construction of a sensor head which is a principal portion of a second embodiment.

This embodiment, as shown in FIG. 4, is characterized by a Faraday element 43b disposed between the birefringent plate 42 and Faraday element 43a. The other aspects of construction are the same as in the first embodiment, and will not be described here.

A bias magnetic field is applied beforehand to the Faraday element 43b to rotate the plane of polarization of each of the two polarized rays Ra1 and Ra2 separated by the birefringent plate 42 and transmitted through the Faraday element 43b, by π/8 relative to the plane of polarization of the parallel light exiting the collimating lens 41. This Faraday element 43b corresponds to the element for giving a predetermined rotating angle in this invention. It should be noted that this element is not limited to the Faraday element.

In this embodiment, the Faraday element 43b is used to give the rotating angle of π/8 to the two polarized rays Ra1 and Ra2 beforehand in order to detect rotating directions of the planes of polarization of polarized rays (Ra1)1 and (Ra2)2 with high sensitivity.

The polarized light transmitted through the Faraday elements 43b and 43a to the reflecting mirror 44 on the end surface has a vector component expressed by equation (4b) below. The polarized light reflected by the reflecting mirror 44 and having passed through the Faraday elements 43a and 43b has a vector component expressed by equation (6b) below.

$$G = \begin{pmatrix} \cos(SH+\frac{\pi}{8}) & \sin(SH+\frac{\pi}{8}) \\ -\sin(SH+\frac{\pi}{8}) & \cos(SH+\frac{\pi}{8}) \end{pmatrix} \quad (4b)$$

$$H = \begin{pmatrix} \cos[-(SH+\frac{\pi}{8})] & \sin[-(SH+\frac{\pi}{8})] \\ -\sin[-(SH+\frac{\pi}{8})] & \cos[-(SH+\frac{\pi}{8})] \end{pmatrix} \quad (6b)$$

The rotating directions of the planes of polarization are detected on the following principle.

Since the aspects of construction and conditions except the Faraday element 43b are the same as in the first embodiment described hereinbefore, the two orthogonally polarized rays (Ra1)1 and (Ra2)2 outputted from the sensor head 40 may be expressed by the following equations (9b) and (10b), using the foregoing equations (1) to (3), (5) to (8) and (4b) and (6b) of vector components, and using Jones matrix:

polarized ray $(Ra1)1 = G \cdot J \cdot E \cdot I \cdot B \cdot A$ \quad (9b)

polarized ray $(Ra2)2 = H \cdot J \cdot E \cdot I \cdot C \cdot A$ \quad (10b)

Light intensity W detected by the photodetector 50 is equal to a value obtained by squaring each of the above equations (9b) and (10b) to convert the vector component into an energy component and adding the two together. That is, light intensity W may be expressed by the following equation (11b):

$W = \frac{1}{2} - \frac{1}{2}\sin(4SH)$ \quad (11b)

In the above operational expression, a series expansion is performed to second order by assuming a range of weak magnetic field measurement (4SH<<1) for making sin(4SH) ≈4SH.

The result may be expressed by the following equation (12b):

$W = \frac{1}{2} - 2SH$ \quad (12b)

Further, in the above equation (12b), assuming that light (initial light) outputted from the light source device 10 is transmitted to the sensor head 40 without being influenced by disturbances, and that the light is outputted from the sensor head 40 with the planes of polarization not rotated by a magnetic field (H=0), the value becomes half (½) the intensity of the initial light. This value of ½ may be set as a reference value in advance for comparison with actual detection results. By determining a plus or minus strength of a magnetic field relative to the reference value, rotating directions of the planes of polarization, i.e. a direction of measured magnetic field H, may be detected.

[Third Embodiment]

Figure 5:
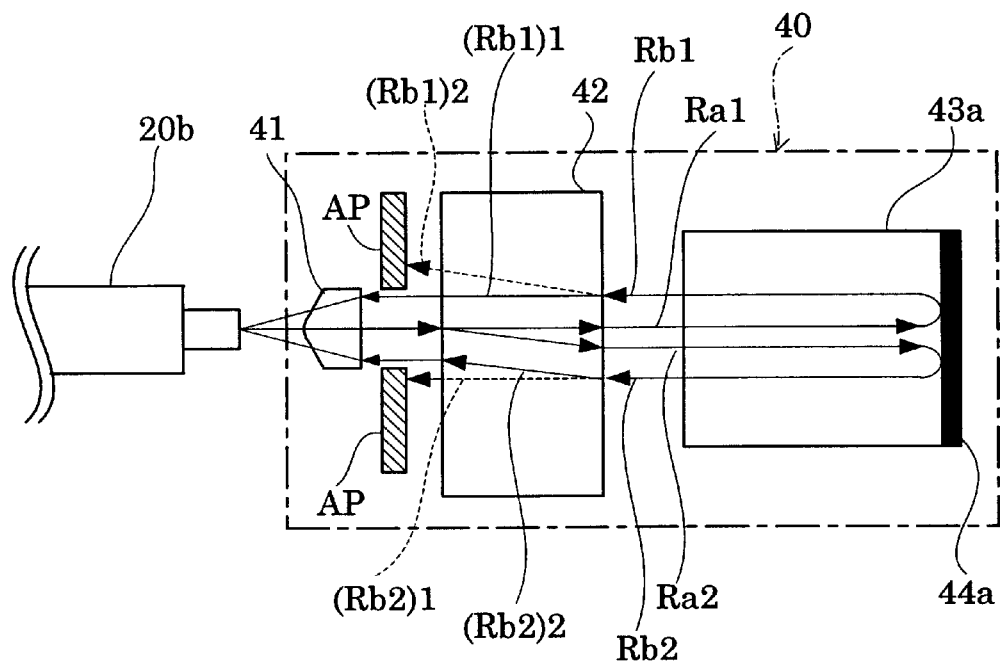
FIG. 5 is a view showing a construction of a magnetic head of a magnetic sensor in a third embodiment.

FIG. 5 is a view showing a construction of a sensor head which is a principal portion of a third embodiment.

This embodiment, as shown in FIG. 5, is characterized by an aperture plate AP disposed between the collimating lens 41 and birefringent plate 42 and defining a pinhole for passing only the two polarized rays to be detected. The other aspects of construction are the same as in the first embodiment, and will not be described here.

Polarized light incident on the birefringent plate 42 is separated into an ordinary ray Ra1 having an unrotated plane of polarization and an extraordinary ray Ra2 having a rotated plane of polarization. Each of these two polarized rays Ra1 and Ra2 is transmitted through the Faraday element 43a and reflected by the reflecting mirror 44 to travel back, as polarized ray Rb1 or Rb2, along an optical path substantially the same as the incidence optical path. Each of the two polarized rays Rb1 and Rb2 is transmitted through the birefringent plate 42 again to be separated into an ordinary ray (Rb1)1 or (Rb2)1 with the plane of polarization not rotated during transmission through the Faraday element 43a and an extraordinary ray (Rb1)2 or (Rb2)2 with the plane of polarization rotated. Thus, four polarized rays in total are formed. Of the four polarized rays exiting the birefringent plate 42, the polarized rays (Rb1)1 and (Rb2)2 adjacent and orthogonal to each other are selected by the aperture plate AP to travel to the collimating lens 41.

Thus, with the aperture plate AP disposed between the collimating lens 41 and birefringent plate 42, two polarized rays to be detected which are adjacent and orthogonal to each other may be selected easily even where the four polarized rays separated in the birefringent plate 42 are close together. That is, the birefringent plate 42 may be formed thin to allow only small spacing among the polarized rays separated. This feature allows the sensor head 40 to be formed compact.

[Fourth Embodiment]

Figure 6:
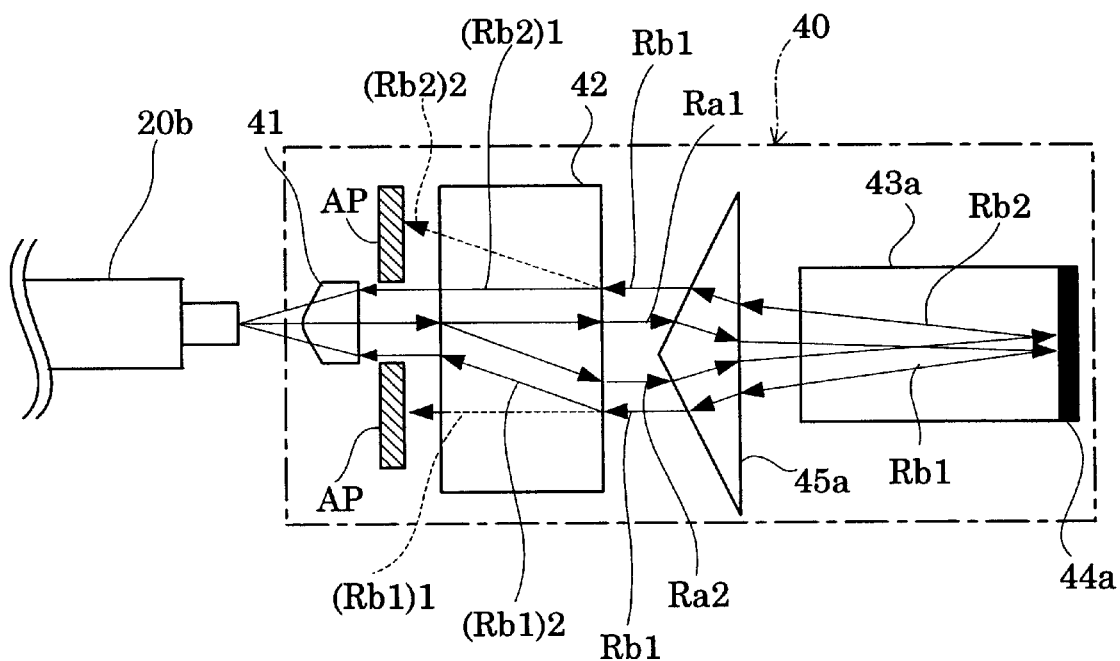
FIG. 6 is a view showing a construction of a magnetic head of a magnetic sensor in a fourth embodiment.

FIG. 6 is a view showing a construction of a sensor head which is a principal portion of a fourth embodiment.

This embodiment, as shown in FIG. 6, is characterized by a prism 45a acting as a second optical device disposed between the birefringent plate 42 and Faraday element 43a. The other aspects of construction are the same as in the third embodiment, and will not be described here.

The prism 45a has the apex of the isosceles triangle opposed to the birefringent plate 42.

The two polarized rays Ra1 and Ra2 exiting the birefringent plate 42 and incident on the prism 45a are refracted and emitted to the Faraday element 43a. In the course of transmission through the Faraday element 43a, the two polarized rays Ra1 and Ra2 intersect each other and are reflected by the reflecting mirror 44a. The two polarized rays Rb1 and Rb2 reflected swap the optical paths, so that the polarized ray Rb1 returns along substantially the same optical path as the ray Ra2, and the other polarized ray Rb2 returns along substantially the same optical path as the ray Ra1. In the course of transmission through the birefringent plate 42, each of the polarized rays Rb1 and Rb2 is further separated into polarized rays (Rb1)1 and (Rb1)2 or (Rb2)1 and (Rb2)2, thereby forming four rays to be emitted toward the aperture plate AP. The aperture plate AP selects, for detection, the polarized rays (Rb1)2 and (Rb2)1 adjacent and orthogonal to each other and allows these rays to travel to the collimating lens 41.

Where the Faraday element 43a has position dependence for crystal sensitivity, the two polarized rays are given the same level of extra error in rotating angle of the planes of polarization by the position dependence for crystal sensitivity of Faraday element 43a, by reciprocating the two polarized rays, with the optical paths swapped, through the Faraday element 43a. As a result, there is no need to consider measurement errors even though variations may occur in intensity ratio between the polarized rays Ra1 and Ra2 due to disturbances acting on the optical fibers.

In this embodiment, the prism 45a is used as the second optical device. The prism 45a is not limitative, but a lens, for example, may be used instead. Further, the aperture plate AP used for selecting two polarized rays to be detected may be omitted.

[Fifth Embodiment]

Figure 7:
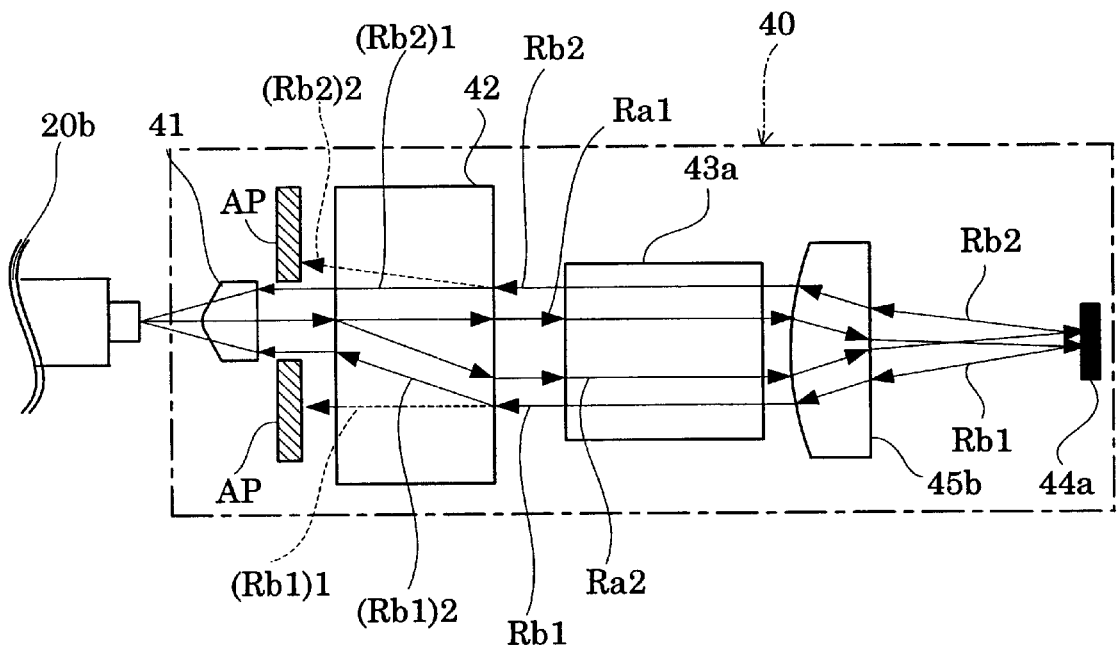
FIG. 7 is a view showing a construction of a magnetic head of a magnetic sensor in a fifth embodiment.

FIG. 7 is a view showing a construction of a sensor head which is a principal portion of a fifth embodiment.

This embodiment, as shown in FIG. 7, is characterized in that the reflecting mirror 44a is disposed adjacent the Faraday element 43a, and a lens 45b acting as a second optical device is disposed between the Faraday element 43a and reflecting mirror 44a. The other aspects of construction are the same as in the third embodiment, and will not be described here.

The lens 45b transmits and refracts the two polarized rays Ra1 and Ra2 emitted from the Faraday element 43a. The two polarized rays Ra1 and Ra2 exiting this lens 45b intersect each other at a point on the reflecting mirror 44a, change the optical paths, and are reflected by the reflecting mirror 44a. The polarized rays Rb1 and Rb2 reflected swap the optical paths. That is, the polarized ray Rb1 reflected by the reflecting mirror 44a returns along substantially the same optical path as the polarized ray Ra2, and the other polarized ray Rb2 returns along substantially the same optical path as the polarized ray Ra1.

As a result, the two polarized rays are given the same level of error in rotating angle of the planes of polarization by the Faraday element 43a having position dependence for crystal sensitivity. Thus, where the Faraday element 43a has position dependence for crystal sensitivity, there is no need to consider measurement errors even though variations may occur in intensity ratio between the polarized rays Ra1 and Ra2 due to disturbances acting on the optical fibers.

Further, each of the two groups of polarized rays Ra1, Ra2 and Rb1, Rb2 reciprocating through the Faraday element 43a proceeds along the direction of a magnetic field in the Faraday element 43a, and is therefore not subjected to extra components other than the measured magnetic field. As a result, a further improvement is made in measurement sensitivity.

[Sixth Embodiment]

Figure 8:
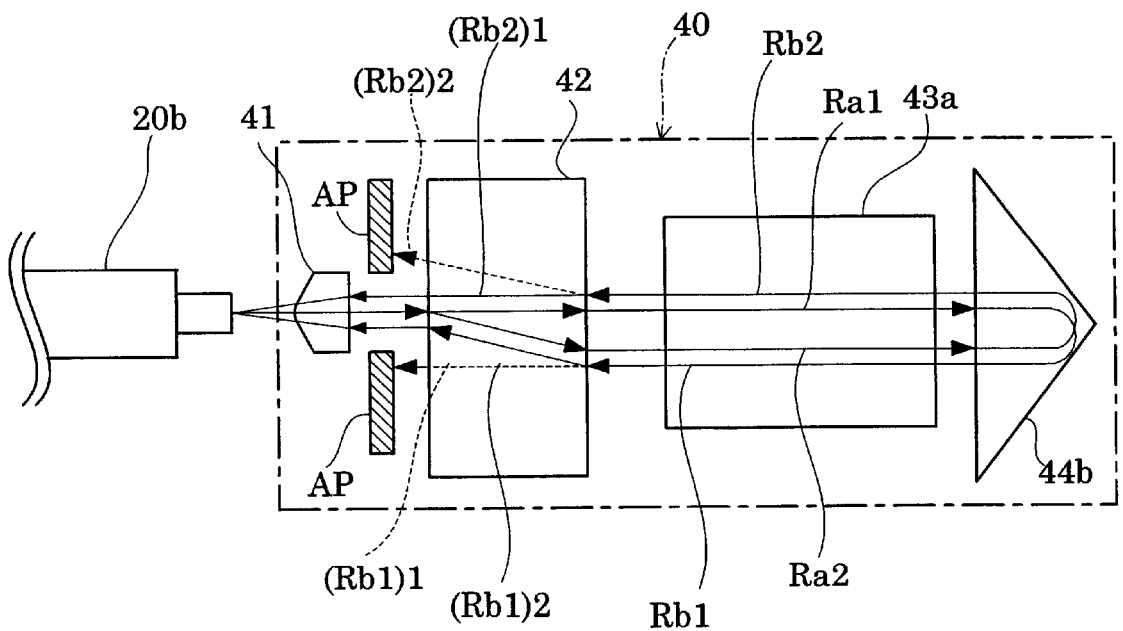
FIG. 8 is a view showing a construction of a magnetic head of a magnetic sensor in a sixth embodiment.

FIG. 8 is a view showing a construction of a sensor head which is a principal portion of a sixth embodiment.

This embodiment, as shown in FIG. 8, is characterized by a rectangular prism 44b disposed adjacent the polarized ray exit end of Faraday element 43a to act as a reflecting device. The other aspects of construction are the same as in the third embodiment, and will not be described here.

The rectangular prism 44b has the apex remote from the Faraday element 43a, with reflection coatings applied to opposite slant sides of the apex.

Each of the two polarized rays Ra1 and Ra2 incident on the rectangular prism 44b reaches reflection coatings on the slant sides to be refracted at right angles twice and returned to the Faraday element 43a. At this time, the two returning polarized rays Rb1 and Rb2 swap the optical paths. That is, the polarized ray Rb1 returns along substantially the same optical path as the polarized ray Ra2, and the other polarized ray Rb2 returns along substantially the same optical path as the polarized ray Ra1.

With the rectangular prism 44b causing the two polarized rays Ra1 and Ra2 to travel back while swapping the return optical paths, the two polarized rays Ra1 and Ra2 are given the same level of error in rotating angle of the planes of polarization by the Faraday element 43a having position dependence for crystal sensitivity. As a result, where the Faraday element 43a has position dependence for crystal sensitivity, there is no need to consider measurement errors even though variations may occur in intensity ratio between the polarized rays Ra1 and Ra2 due to disturbances acting on the optical fibers.

[Seventh Embodiment]

Figure 9:
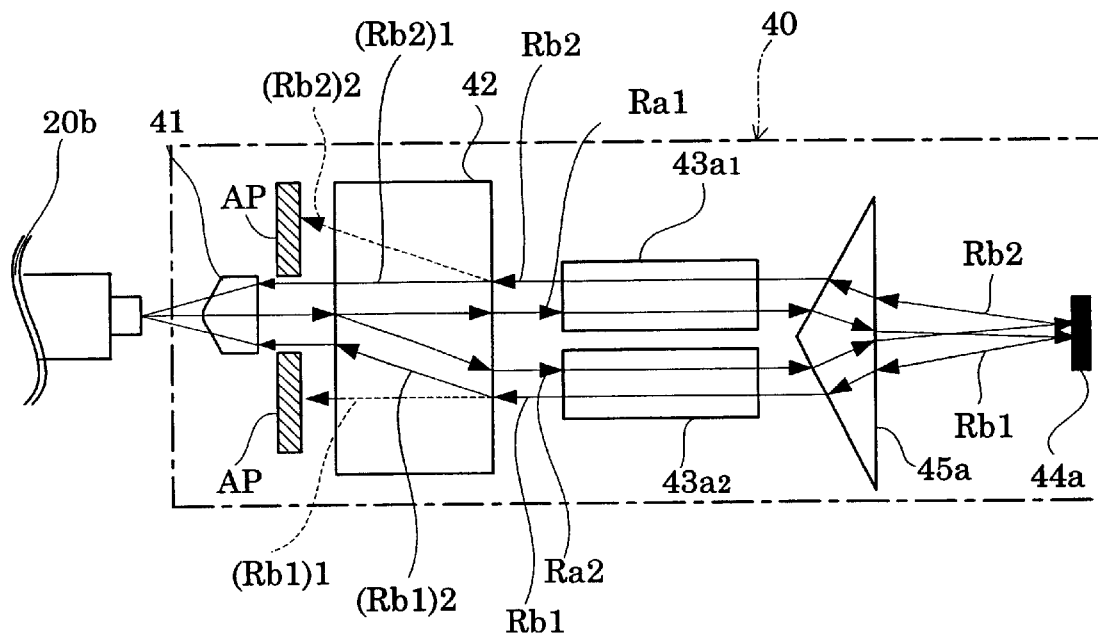
FIG. 9 is a view showing a construction of a magnetic head of a magnetic sensor in a seventh embodiment.

FIG. 9 is a view showing a construction of a sensor head which is a principal portion of a seventh embodiment.

This embodiment, as shown in FIG. 9, is characterized in that two first Faraday elements 43a (43a1 and 43a2) are arranged parallel to each other to transmit the two polarized rays Ra1 and Ra2 along the direction of a magnetic field, and that a prism 45a is disposed between the first Faraday elements 43a1 and 43a2 and the reflecting mirror 44a adjacent the Faraday elements 43a1 and 43a2. The prism 45a acts as a second optical device for swapping the optical paths of the two polarized rays. The other aspects of construction are the same as in the third embodiment, and will not be described here.

The Faraday elements 43a are crystals of small sectional area prepared by FZ (Floating Zone) method or the like, and produce high Faraday effect. Each of the two polarized rays Ra1 and Ra2 transmitted through the Faraday elements 43a is refracted during transmission through the prism 45a and is emitted therefrom. These two refracted polarized rays Ra1 and Ra2 intersect each other before reaching the reflecting mirror 44a. The two polarized rays Rb1 and Rb2 reflected by the reflecting mirror 44a pass through the prism 45a with the optical paths swapped, each traveling back along an optical path substantially the same as the incident optical path of the other.

That is, by dividing the Faraday element 43a into two parts (43a1 and 43a2), crystals of small sectional area may be prepared by FZ method used to realize high Faraday effect. Further, with the two polarized rays Ra1 and Ra2 swapping the forward and backward paths and traveling through the different Faraday elements 43a1 and 43a2, respectively, the two polarized rays are given the same level of error in rotating angle of the planes of polarization by the Faraday elements 43a1 and 43a2 having position dependence for crystal sensitivity. Thus, where the Faraday elements 43a have position dependence for crystal sensitivity, there is no need to consider measurement errors even though variations may occur in intensity ratio between the polarized rays Ra1 and Ra2 due to disturbances acting on the optical fibers.

[Eighth Embodiment]

Figure 10:
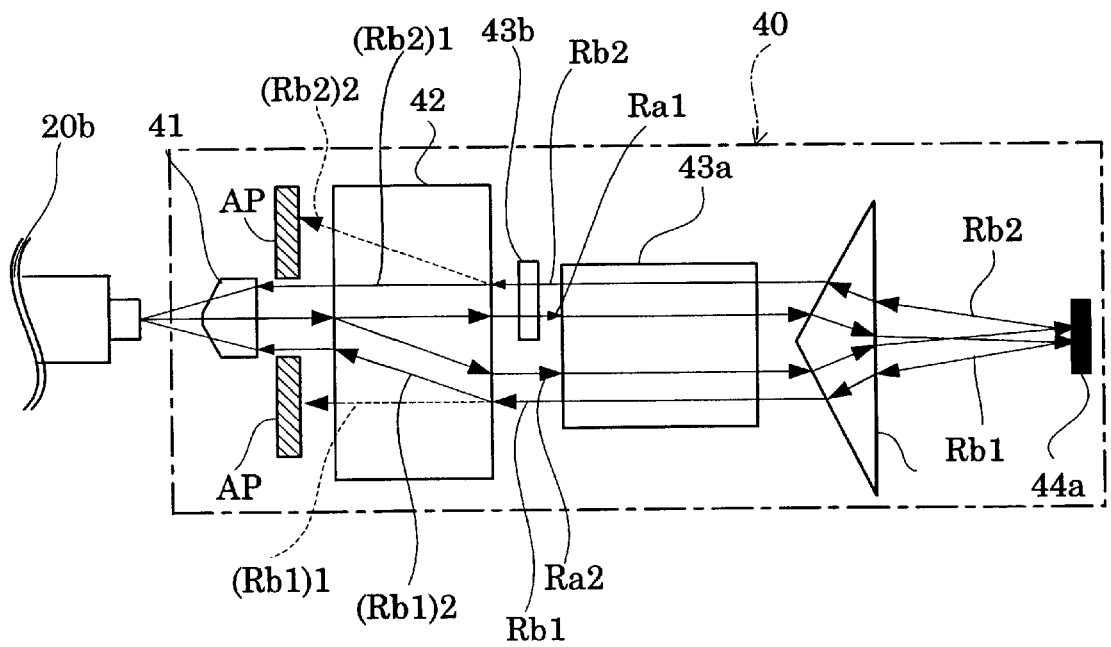
FIG. 10 is a view showing a construction of a magnetic head of a magnetic sensor in an eighth embodiment.

FIG. 10 is a view showing a construction of a sensor head which is a principal portion of an eighth embodiment.

This embodiment, as shown in FIG. 10, is characterized in that a Faraday element 43b is disposed between the birefringent plate 42 and Faraday element 43a, a bias magnetic field being applied to the Faraday element 43b beforehand to give a predetermined rotating angle to the planes of polarization, and that a prism 45a is disposed between the Faraday element 43a and the reflecting mirror 44a adjacent the Faraday element 43a to act as a second optical device for refracting the two polarized rays to change the optical paths. The other aspects of construction are the same as in the third embodiment, and will not be described here.

The Faraday element 43b rotates the planes of polarization by 45° beforehand. Each of the two polarized rays separated by the birefringent plate 42 and reciprocating through the sensor head 40 passes through the Faraday element 43b once.

That is, as shown in FIG. 10, of the two polarized rays Ra1 and Ra2 separated by the birefringent plate 42 first, the polarized ray Ra1 passes through the Faraday element 43b, Faraday element 43a and prism 45a in the stated order. At this time, the polarized ray Ra2 passes through the Faraday element 43a and prism 45a in the stated order. The two polarized rays Ra1 and Ra2 are refracted by and outputted from the prism 45a to intersect each other before reaching the reflecting mirror 44a. The two polarized rays Rb1 and Rb2 reflected by the reflecting mirror 44a pass through the prism 45a with the optical paths swapped, each traveling back along an optical path substantially the same as the incident optical path of the other. The polarized ray Rb1 is returned through the prism 45a and Faraday element 43a in the stated order, and emitted toward the birefringent plate 42. On the other hand, the polarized ray Rb2 is returned through the prism 45a, Faraday element 43a and Faraday element 43b in the stated order, and emitted toward the birefringent plate 42.

By transmitting each polarized ray once through the Faraday element 43b that gives a predetermined rotating angle to each of the two planes of polarization beforehand, it is possible to minimize errors due to a product tolerance of the Faraday element 43b. That is, the product tolerance is determined beforehand. When each polarized ray were passed twice, both forward and backward, through the Faraday element 43b to have the plane of polarization rotated by 45° beforehand, with the Faraday element 43b having product specifications for a rotating angle of 22.5° plus/minus 0.5°, the plane of polarization would receive a difference due to the tolerance of 1.0° in total. On the other hand, when each polarized ray is passed once through the Faraday element 43b having product specifications for a rotating angle of 45° plus/minus 0.5°, the plane of polarization receives a difference due to the tolerance of only 0.5°.

Since the Faraday element 43b used may have a size for transmitting one of the polarized rays, the sensor head 40 may be formed compact. It is also possible to use an element designed for an isolator as used widely. This achieves a reduction in cost.

[Ninth Embodiment]

Figure 11:
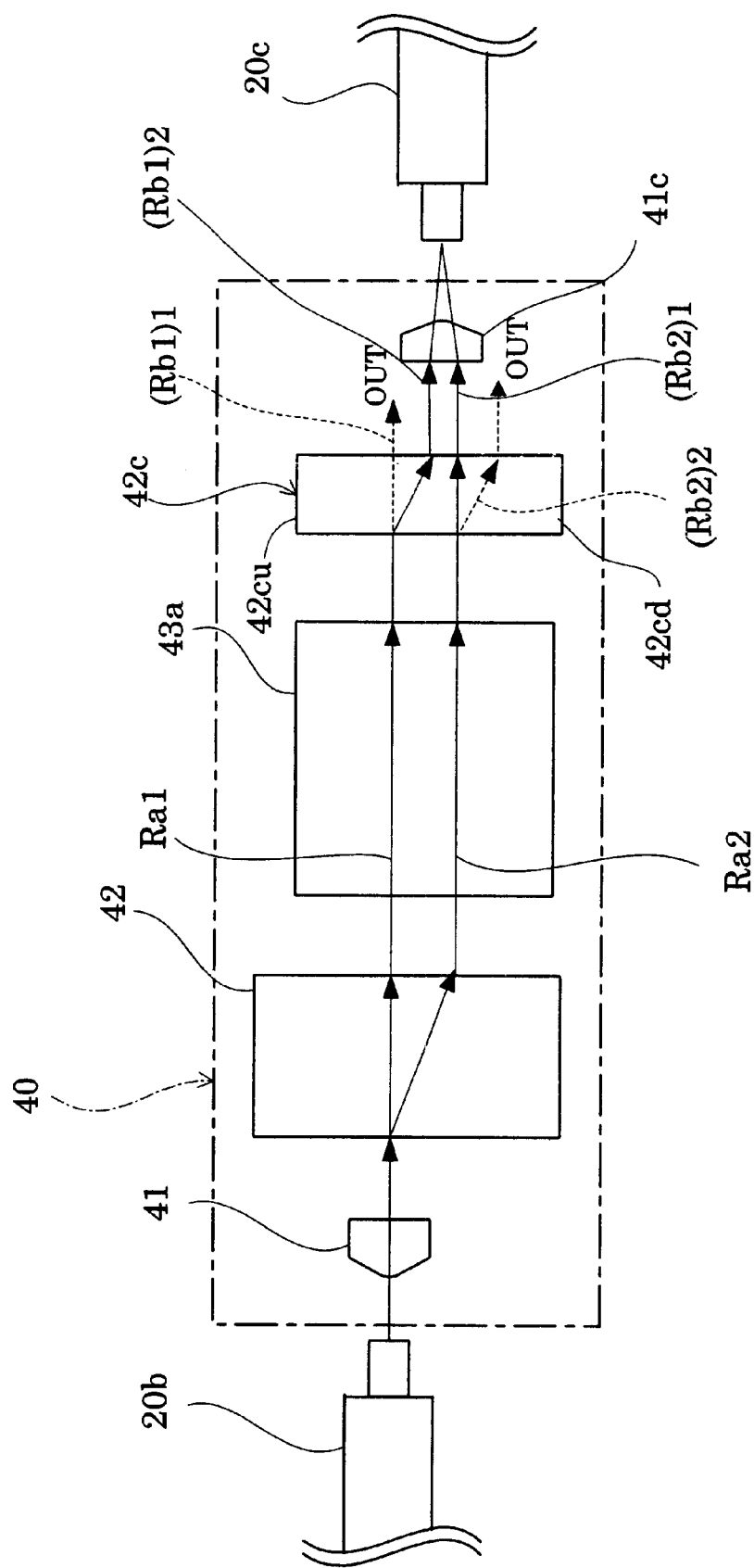
FIG. 11 is a view showing a construction of a magnetic head of a magnetic sensor in a ninth embodiment.

FIG. 11 is a view showing a construction of a sensor head which is a principal portion of a ninth embodiment.

This embodiment, as shown in FIG. 11, is characterized in that a pair of collimating lenses 41 and 41c and a pair of birefringent plates 42 and 42c are arranged symmetrically across the Faraday element 43a, and that the sensor head 40 has, connected thereto, an optical fiber 20b that transmits light (initial light) from the light source device 10, and an optical fiber 20c for transmitting two polarized rays outputted from the sensor head 40 to be detected, the optical fiber 20c being connected also to the light detecting device. The optical fibers 20a and 20b correspond to the first and second light transmitting devices of this invention. The collimating lenses 41 and 41c correspond to the first and third optical devices. The birefringent plates 42 and 42c correspond to the first and second birefringent plates.

In this embodiment, the two polarized rays Rb1 and Rb2 transmitted once through the Faraday element 43a are then transmitted through the birefringent plate 42c to be separated into two groups of polarized rays (four polarized rays in total) orthogonal to each other and different in the ratio of light intensity according to the rotating angle of the planes of polarization. One group includes rays (Rb1)1 and (Rb1)2, while the other group includes (Rb2)1 and (Rb2)2. That is, from the two groups of polarized rays orthogonal to each other, the collimating lens 41c selects and outputs two polarized rays (Rb1)2 and (Rb2)1 belonging to different groups, and adjacent and orthogonal to each other. There- after the polarized rays (Rb1)2 and (Rb2)1 are transmitted through the optical fiber 20c to the photodetector 50. Alternatively, an upper portion 42cu and a lower portion 42cd of birefringent plate 42c shown in FIG. 11 may be interchanged to select the polarized rays (Rb1)1 and (Rb1)2 adjacent and orthogonal to each other.

The other aspects of construction and function are similar to those in the preceding embodiments, and will not be described.

The second embodiment may be modified to provide the same symmetrical construction across the Faraday element 43a as in the ninth embodiment. A Faraday element to which a magnetic field is applied may be arranged with one of the birefringent plate 42 and Faraday element 43a or one of the birefringent plate 42c and collimating lens 41c.

This invention is not in limited to the foregoing embodiments, but may be modified as follows.

In the fourth to eighth embodiments, the aperture plate AP is disposed between the collimating lens 41 and birefringent plate 42. However, the aperture plate AP may be omitted from these embodiments.

The present invention may be embodied in other specific forms without departing from the spirit or essential attributes thereof and, accordingly, reference should be made to the appended claims, rather than to the foregoing specification, as indicating the scope of the invention.

What is claimed is:

1. A magnetic sensor utilizing a phenomenon in which a plane of polarization of light traveling through a Faraday element rotates in proportion to the strength of a magnetic field, said magnetic sensor comprising:

light output means;

light branching means connected to said light output means through first light transmitting means;

a sensor head connected to said light branching means through second light transmitting means;

light detecting means connected to said light branching means through third light transmitting means; and computing means for receiving detected signals from said light detecting means;

said sensor head including optical means, a first birefringent plate, a first Faraday element and reflecting means arranged in series from an end of said sensor head connected to said second light transmitting means;

said light output means outputting light;

said light branching means receiving the light transmitted from said light output means through said first light transmitting means, and emitting the light to said second light transmitting means;

said optical means of said sensor head converting the light transmitted from said light branching means through said second light transmitting means into parallel light;

said first birefringent plate of said sensor head separating the parallel light received from said optical means into two polarized rays having planes of polarization orthogonal to each other with respect to an optical axis of said first birefringent plate;

said first Faraday element of said sensor head transmitting the two polarized rays from said first birefringent plate, and converting the strength of a magnetic field to be detected into a rotating angle of the planes of polarization of the two polarized rays;

said reflecting means of said sensor head reflecting the two polarized rays transmitted through said first Faraday element, back into said first Faraday element, such that each of the two polarized rays reciprocates along the same optical path;

said first birefringent plate of said sensor head separating each of said two polarized rays returned from said first Faraday element into two polarized rays (four polarized rays in total) orthogonal to each other and having an amplitude level corresponding to the rotating angle of the respective polarized rays;

said optical means of said sensor head selectively transmitting two orthogonal polarized rays returning along optical paths substantially the same as incidence optical paths, among the four polarized rays emitted from said first birefringent plate;

said light branching means branching the two polarized rays transmitted from said optical means through said second light transmitting means, to said third light transmitting means:

said light detecting means detecting light intensities of the two polarized rays transmitted from said light branching means through said third light transmitting means; and said computing means deriving the strength of the magnetic field from the light intensities detected by said light detecting means.

2. A magnetic sensor as defined in claim 1, further comprising an element disposed between said first birefringent plate and said first Faraday element for giving a predetermined rotating angle to the plane of polarization of each of the two polarized rays separated by said first birefringent plate.

3. A magnetic sensor as defined in claim 2, wherein said element is a second Faraday element having a predetermined magnetic field applied thereto beforehand.

4. A magnetic sensor as defined in claim 1, further comprising an aperture plate disposed between said optical means and said first birefringent plate and defining a pinhole for passing the two polarized rays to be detected.

5. A magnetic sensor as defined in claim 1, further comprising second optical means disposed between said first birefringent plate and said first Faraday element;

said second optical means refracting two incident polarized rays, and emitting the polarized rays to said first Faraday element, such that said polarized rays intersect each other in said first Faraday element;

said reflecting means reflecting the two polarized rays emitted from said first Faraday element, such that said polarized rays swap optical paths, each returning along an optical path substantially the same as an incidence optical path of the other.

6. A magnetic sensor as defined in claim 1, wherein said reflecting means is attached to a light output end of said first Faraday element.

7. A magnetic sensor as defined in claim 6, wherein said reflecting means is a reflecting mirror.

8. A magnetic sensor as defined in claim 6, wherein said reflecting means is a rectangular prism with reflection coatings applied to polarized light output slant sides thereof.

9. A magnetic sensor as defined in claim 1, wherein said reflecting means is disposed adjacent a light output end of said first Faraday element.

10. A magnetic sensor as defined in claim 9, wherein said reflecting means is a reflecting mirror.

11. A magnetic sensor as defined in claim 9, wherein said reflecting means is a rectangular prism with reflection coatings applied to polarized light output slant sides thereof.

12. A magnetic sensor as defined in claim 10, further comprising second optical means disposed between said first Faraday element and said reflecting means;

said second optical means refracting two incident polarized rays from said first Faraday element, and emitting the two polarized rays to said reflecting means, such that said two polarized rays intersect each other before reaching said reflecting means;

said reflecting means reflecting the two polarized rays, such that said polarized rays swap optical paths, each returning along an optical path substantially the same as an incidence optical path of the other.

13. A magnetic sensor as defined in claim 10, wherein said first Faraday element is in form of two separate Faraday elements arranged parallel to each other in a traveling direction of the two polarized rays, such that the two polarized rays separated by said first birefringent plate are transmitted through said separate Faraday elements, respectively.

14. A magnetic sensor as defined in claim 12, further comprising second optical means disposed between said first birefringent plate and said first Faraday element;

said second Faraday element transmitting and emitting one of the two polarized rays separated by said first birefringent plate;

said second Faraday element transmitting and emitting the other of the two polarized rays after the polarized rays swap the optical paths thereof and return from the reflecting means.

15. A magnetic sensor as defined in claim 1, wherein said first birefringent plate is formed of rutile crystal expressed by $TiO_2$.

16. A magnetic sensor as defined in claim 1, wherein said first birefringent plate is formed of calcite expressed by $CaCO_3$.

17. A magnetic sensor as defined in claim 1, wherein said first birefringent plate is formed of lithium niobate expressed by $LiNbO_3$.

18. A magnetic sensor as defined in claim 1, wherein said first birefringent plate is formed of yttrium vanadate expressed by $YVO_4$.

19. A magnetic sensor as defined in claim 1, wherein said first to third light transmitting means comprise single mode optical fibers.

20. A magnetic sensor as defined in claim 1, wherein said first to third light transmitting means comprise plane of polarization maintaining optical fibers.

21. A magnetic sensor utilizing a phenomenon in which a plane of polarization of light traveling through a Faraday element rotates in proportion to the strength of a magnetic field, said magnetic sensor comprising:

light output means;

a sensor head connected to said light output means through first light transmitting means;

light detecting means connected to said sensor head through second light transmitting means; and computing means for receiving detected signals from said light detecting means;

said sensor head including first optical means, a first birefringent plate, a first Faraday element, a second birefringent plate and third optical means arranged in series from an end of said sensor head connected to said first light transmitting means;

said light output means outputting light;

said first optical means of said sensor head converting polarized light transmitted from said light output means through said first light transmitting means into parallel light;

said first birefringent plate of said sensor head separating the parallel light received from said first optical means into two polarized rays having planes of polarization orthogonal to each other with respect to an optical axis of said birefringent plate;

said first Faraday element of said sensor head transmitting the two polarized rays from said first birefringent plate, and converting the strength of a magnetic field to be detected into a rotating angle of the planes of polarization of the two polarized rays;

said second birefringent plate of said sensor head separating each of said two polarized rays transmitted through said first Faraday element into two polarized rays (four polarized rays in total) orthogonal to each other with respect to an optical axis of said birefringent plate;

said third optical means of said sensor head selectively transmitting two orthogonal polarized rays returning along optical paths substantially the same as incidence optical paths, among the four polarized rays emitted from said second birefringent plate;

said light detecting means detecting light intensities of the two polarized rays transmitted from said second optical means through said second light transmitting means; and said computing means deriving the strength of the magnetic field from the light intensities detected by said light detecting means.

22. A magnetic sensor as defined in claim 21, further comprising an element disposed between said first birefringent plate and said first Faraday element for giving a predetermined rotating angle to the plane of polarization of each of the two polarized rays separated by said first birefringent plate.

23. A magnetic sensor as defined in claim 22, wherein said element is a second Faraday element having a predetermined magnetic field applied thereto beforehand.

24. A magnetic sensor as defined in claim 21, further comprising an element disposed between said first Faraday element and said second birefringent plate for giving a predetermined rotating angle to the plane of polarization of each of the two polarized rays separated by said first birefringent plate.

25. A magnetic sensor as defined in claim 24, wherein said element is a second Faraday element having a predetermined magnetic field applied thereto beforehand.

26. A magnetic sensor as defined in claim 21, further comprising an aperture plate disposed between said second birefringent plate and said third optical means and defining a pinhole for passing the two polarized rays to be detected.

27. A magnetic sensor as defined in claim 21, wherein said first birefringent plate is formed of rutile crystal expressed by $TiO_2$.

28. A magnetic sensor as defined in claim 21, wherein said first birefringent plate is formed of calcite expressed by $CaCO_3$.

29. A magnetic sensor as defined in claim 21, wherein said first birefringent plate is formed of lithium niobate expressed by $LiNbO_3$.

30. A magnetic sensor as defined in claim 21, wherein said first birefringent plate is formed of yttrium vanadate expressed by $YVO_4$.

31. A magnetic sensor as defined in claim 21, wherein said first to second light transmitting means comprise single mode optical fibers.

32. A magnetic sensor as defined in claim 21, wherein said first to second light transmitting means comprise plane of polarization maintaining optical fibers.

* * * * *